(12) United States Patent
Moon et al.

(10) Patent No.: US 12,334,469 B2
(45) Date of Patent: Jun. 17, 2025

(54) PIEZOELECTRIC MATERIALS FOR ON-DIE THERMAL ENHANCEMENT OF HYBRID BONDING AND ASSOCIATED SYSTEMS AND METHODS

(71) Applicant: Micron Technology, Inc., Boise, ID (US)

(72) Inventors: Byung Hoon Moon, Taichung (TW); Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 487 days.

(21) Appl. No.: 17/898,330

(22) Filed: Aug. 29, 2022

(65) Prior Publication Data
US 2024/0071986 A1    Feb. 29, 2024

(51) Int. Cl.
| H01L 23/48 | (2006.01) |
| H01L 23/00 | (2006.01) |
| H01L 23/52 | (2006.01) |
| H01L 29/40 | (2006.01) |

(52) U.S. Cl.
CPC .............. *H01L 24/80* (2013.01); *H01L 24/05* (2013.01); *H01L 24/08* (2013.01); *H01L 2224/05647* (2013.01); *H01L 2224/05686* (2013.01); *H01L 2224/08145* (2013.01); *H01L 2224/80234* (2013.01); *H01L 2224/80379* (2013.01); *H01L 2224/80895* (2013.01); *H01L 2224/80896* (2013.01)

(58) Field of Classification Search
CPC . H01L 24/80; H01L 24/05; H01L 2224/0567; H01L 2224/05686; H01L 2224/08145; H01L 2224/80234; H01L 2224/80379; H01L 2224/80895; H01L 2224/80896; H01L 2224/85205; H01L 2224/0508; H01L 2924/15153; H01L 2224/04042; H01L 24/73; H01L 2224/16145; H01L 2224/32145; H01L 24/75; H01L 25/0655; H01L 2224/0401; H01L 2224/48145; H01L 2224/0558; H01L 24/06; H01L 24/14; H01L 24/17; H01L 2224/08146; H01L 2224/8185; H01L 24/09; H01L 2021/60022; H01L 2224/14; H01L 2224/40145; H01L 2224/13008; H01L 2224/14051; H01L 2224/16147; H01L 2224/16245; H01L 2224/742; H01L 2224/743; H01L 2224/745; H01L 2224/85207; H01L 2224/85801; H01L 2224/852; H01L 24/94; H01L 2021/6002; H02L 24/08
See application file for complete search history.

(56) References Cited

U.S. PATENT DOCUMENTS

2023/0201952 A1*    6/2023    Shah .................. H01L 24/05
228/3.1

* cited by examiner

Primary Examiner — Niki H Nguyen
(74) Attorney, Agent, or Firm — Perkins Coie LLP

(57) ABSTRACT

A semiconductor die is provided, comprising a semiconductor substrate; a dielectric layer over the semiconductor substrate; a bond pad in the dielectric layer, the bond pad including an exposed top surface that is recessed with respect to a surface of the dielectric layer opposite to the semiconductor substrate; and a region of piezoelectric material in the dielectric layer, wherein the region is located proximate to the bond pad to supply thermal energy to the bond pad in response to exposing the piezoelectric material to an externally-applied field.

20 Claims, 5 Drawing Sheets

100B

100C

US 12,334,469 B2

PIEZOELECTRIC MATERIALS FOR ON-DIE THERMAL ENHANCEMENT OF HYBRID BONDING AND ASSOCIATED SYSTEMS AND METHODS

TECHNICAL FIELD

The present disclosure generally relates to semiconductor device assemblies, and more particularly relates to piezoelectric materials for on-die thermal enhancement of hybrid bonding and associated systems and methods.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

In some semiconductor packages, two or more semiconductor dies are stacked on top of each other to reduce the footprint of the semiconductor packages. The semiconductor dies in the stack may be arranged in a pattern resembling stair-steps (which may be referred to as "shingle stacking") such that a portion of the semiconductor dies may be freely accessible—e.g., to attach bond wires to one or more bond pads located in the portion. In some cases, the semiconductor dies may be stacked in a "zig-zag" pattern to increase a space above the bond pads with respect to a semiconductor die overlying above the bond pads so as to facilitate forming the bond wires. Such arrangements, however, tend to increase overall heights of the semiconductor packages. Further, the bond wires may add to the heights and/or introduce delays in signal propagation.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

DETAILED DESCRIPTION

Figure 1:
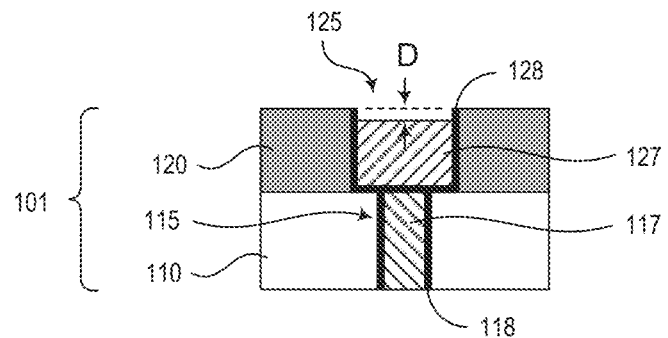
FIG. 1 illustrates various stages of process steps for direct bonding schemes.
Figure 1:
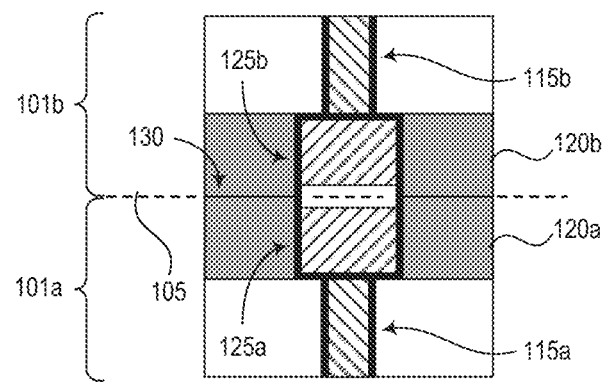
Figure 1:
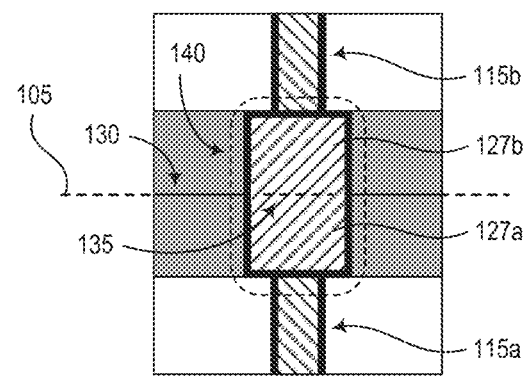

Specific details of several embodiments of on-die temperature control for semiconductor die assemblies, and associated systems and methods are described below. The term "semiconductor device or die" generally refers to a solid-state device that includes one or more semiconductor materials. Examples of semiconductor devices (or dies) include logic devices or dies, memory devices or dies, controllers, or microprocessors (e.g., central processing unit (CPU), graphics processing unit (GPU)), among others.

Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" may include a semiconductor wafer, a package substrate, a semiconductor device or die, or the like. Suitable steps of the methods described herein can be performed with processing steps associated with fabricating semiconductor devices (wafer-level and/or die-level) and/or manufacturing semiconductor packages.

Various computing systems or environments, e.g., high-performance computing (HPC) systems, require high bandwidth and low power consumption. Certain schemes of forming interconnects between semiconductor dies (e.g., a direct bonding scheme) may facilitate satisfying the requirements, as well as providing form-factors suitable for scaling physical dimensions (e.g., heights) of semiconductor die assemblies of the HPC systems. The direct bonding scheme includes individual conductive components (e.g., copper pads, conductive pads, bond pads) of a first semiconductor die (or a first wafer including the first semiconductor die) aligned and directly bonded to corresponding one of conductive components of a second semiconductor die (or a second wafer including the second semiconductor die).

Further, a dielectric material surrounding each of the conductive components of the first semiconductor die can be directly bonded to another dielectric material surrounding each of the conductive components of the second semiconductor die. In other words, the bonding interface includes two or more dissimilar materials of the first semiconductor die directly bonded to corresponding materials of the second semiconductor die (e.g., between dielectric materials, between conductive materials) to form interconnects and surrounding dielectric layers. As such, the direct bonding scheme may also be referred to a combination bonding scheme, a hybrid bonding scheme, or the like.

In some embodiments, the conductive materials include copper (or other suitable conductive materials or metals, such as tungsten) as a primary constituent, and the dielectric materials include silicon oxides (e.g., $SiO_2$), silicon nitrides (e.g., $Si_3N_4$), silicon carbon nitrides (e.g., SiCN), silicon carbonates (e.g., SiCO), or the like. During the direct bonding process, the dielectric materials of the first and second semiconductor dies (or the first and second wafers including the first and second semiconductor dies) are brought together such that the dielectric materials adhere to each other and hermetically seal the conductive components aligned to each other.

Subsequently, the semiconductor dies are annealed at an elevated temperature (e.g., post bond annealing process) such that the conductive materials of the conductive components can expand—e.g., swell vertically toward the bonding interface—at least partially due to the differences in coefficients of thermal expansion (CTE) between the conductive materials and the dielectric materials (which may be referred to as CTE-based expansion). Eventually, the conductive materials are conjoined to form permanent bonding between them—e.g., metallurgical bonding. Additionally, the dielectric materials may enhance their bonding strength during the post bond annealing process.

In some embodiments, the post bond annealing temperature may reach approximately 400° C. or higher. As the semiconductor dies include fully processed semiconductor components (e.g., diodes, metal-oxide-semiconductor field-effect-transistors (MOSFETs)), the additional thermal budget during the annealing process may degrade electrical characteristics of the semiconductor components and/or performance of the circuits including the semiconductor components (e.g., integrated circuitry). Accordingly, eliminating the post bond annealing process steps or reducing the post bond annealing process temperature may avoid risks to the semiconductor dies undergoing the direct bonding process steps.

The present technology provides localized thermal energy to facilitate CTE-based expansion of the conductive components (e.g., copper pads) such that the conductive components form metallurgical bonding at a lower post bond annealing temperature (or without the post bond annealing process, in some cases). The localized thermal energy may be sufficiently far from the integrated circuitry so as to avoid or reduce adverse effects stemming from the localized thermal energy. Accordingly, the present technology can mitigate risks associated with the thermal budget during the hybrid bonding process steps.

The localized thermal energy may be obtained by generating heat with one or more regions of piezoelectric material that are located proximate to the conductive components, where the piezoelectric material can generate the heat for the conductive components during the hybrid bonding process, for example, in response to an alternating (e.g., oscillating and/or rotating) electric field. In this manner, in some embodiments, the localized thermal energy supplements the thermal energy provided by the post bond annealing process—e.g., permitting the use of a lower environmental (e.g., oven) temperature during the post bond annealing process. In some embodiments, the localized thermal energy generated by the piezoelectric material may suffice to replace the thermal energy provided by the post bond annealing process, thereby eliminating the post bond annealing process.

As used herein, the terms "front," "back," "vertical," "lateral," "down," "up," "top," "bottom," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1 illustrates various stages of process steps for direct bonding schemes. Diagram 100A illustrates a portion of a semiconductor die 101 with a substrate 110 having integrated circuitry (not shown) and a through-substrate via (TSV) 115 coupled with the integrated circuitry. In some embodiments, the TSV 115 includes a first conductive material 117 (e.g., tungsten) and a conductive barrier layer 118 (e.g., TiN). The semiconductor die 101 also includes a conductive pad 125 (which may also be referred to as a bond pad) formed in a dielectric layer 120 (e.g., silicon oxides, silicon nitrides, silicon carbon nitrides, silicon carbonates, or a combination thereof). The conductive pad 125 is electrically connected to the TSV 115 (and to the integrated circuitry through the TSV 115). In some embodiments, the conductive pad 125 includes a second conductive material 127 (e.g., copper) and another conductive barrier layer 128 (e.g., TaN).

The conductive pad 125 depicted in diagram 100A includes a surface recessed by a depth D with respect to the surface of the dielectric layer 120 (i.e., the surface opposite to the substrate 110). In some embodiments, CMP process steps are used to form the conductive pad 125, and the recess may be a result of the CMP process. For example, the recess may be formed during over-polishing steps that remove excessive conductive material 127 on the surface of the dielectric layer 120. Moreover, the amount of recess (e.g., the recess depth D) may be targeted to ensure the surface of the conductive pad 125 not to protrude above the surface of the dielectric layer 120—e.g., to avoid such protruded conductive pads 125 interfering with the bonding process described with reference to diagram 100B. The amount of recess may be targeted to be within a certain range such that the conductive materials 127 can form an interconnect 140 as described with reference to diagram 100C without compromising the bonding integrity.

Diagram 100B illustrates two semiconductor dies 101a and 101b (or two wafers including the semiconductor dies 101a and 101b) that are attached together such that dielectric materials of the top semiconductor die 101b and bottom semiconductor die 101a adhere to each other to form dielectric-to-dielectric bonding 130 at the bonding interface 105. In some embodiments, the dielectric surfaces are activated (e.g., using a plasma treatment process) to facilitate the bonding of the dielectric surfaces. Also, conductive pads (e.g., the top conductive pad 125b and the bottom conductive pad 125a) of the top and bottom semiconductor dies 101a and 101b are aligned to face each other but are not connected to each other due to the recessed surfaces of the conductive pads 125a/b.

Diagram 100C illustrates that the bonded dies/wafers are annealed in an elevated temperature (e.g., around 400° C.) such that the conductive materials of the top and bottom conductive pads 125a/b may expand toward each other in response to receiving thermal energy during the post bond annealing process (e.g., due to the mismatch in CTEs between the conductive materials and the dielectric materials) within the open space defined by the recess surfaces and the dielectric material surrounding the conductive pads 125a/b.

When the surfaces of the top and bottom conductive materials are in contact as a result of the CTE-based expansion, the conductive materials are conjoined (e.g., via atomic migration (intermixing, diffusion) from one conductive material to another conductive material) to form metal-to-metal bonding 135—e.g., metallurgical bonding, permanent bonding. Once the metallurgical bonding is formed between the conductive pads 125a/b (thus, forming the interconnect 140), the conductive materials do not separate (or sever) when the bonded dies/wafers are brought to the ambient temperature or operating temperatures of the semiconductor die assemblies. In this manner, the bonding interface 105 includes the dielectric-to-dielectric bonding 130 and the metal-to-metal bonding 135.

Figure 2:
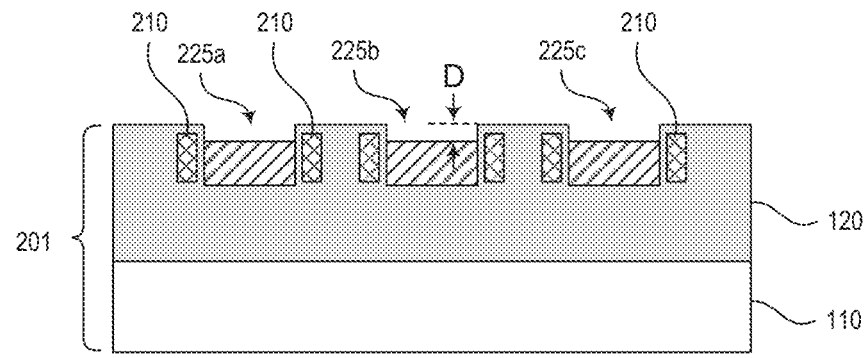
FIG. 2 illustrates example schematic diagrams depicting stages of forming semiconductor die assemblies in accordance with embodiments of the present technology.
Figure 2:
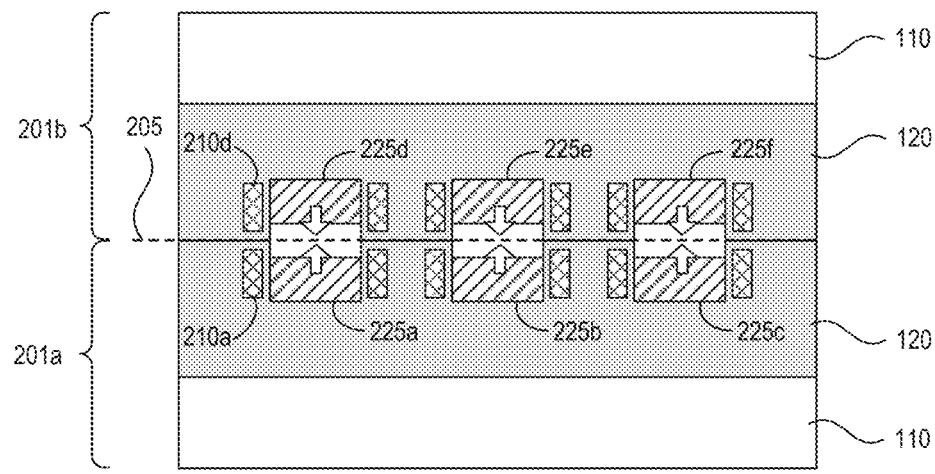

FIG. 2 illustrates example schematic diagrams 200A and 200B depicting stages of forming semiconductor die assemblies in accordance with embodiments of the present technology. Diagram 200A illustrates a portion of a semiconductor die 201, which may be an example of or include aspects of the semiconductor die 101 described with reference to FIG. 1. For example, the semiconductor die 201 includes the substrate 110 having integrated circuitry (not shown) and the dielectric layer 120.

The semiconductor die 201 also includes one or more conductive pads 225 (also identified individually as 225a-c) formed in the dielectric layer 120. The conductive pads 225 may be examples of or include aspects of the conductive pads 125 described with reference to FIG. 1. The TSVs 115 coupling the conductive pads 225 to the integrated circuitry are omitted in FIG. 2. The conductive pad 225 has a surface recessed with respect to the surface of the dielectric layer 120 (the amount of recess denoted as D)—e.g., as a result of the CMP process described with reference to FIG. 1. As shown in diagram 200A, the surface of the conductive pad 225 is uncovered (i.e., exposed).

The semiconductor die 201 also includes one or more regions 210 of piezoelectric material in the dielectric layer 120. The regions 210 may be laterally spaced apart from the conductive pads 225, as illustrated, or may be immediately adjacent the conductive pads (e.g., when the piezoelectric material used is non-conductive). The regions 210 of piezoelectric material may be located proximate to the conductive pads 225 (e.g., with a lateral spacing from the conductive pads 225 less than a width of the conductive pads) such that the piezoelectric material, when energized by an externally-applied alternating electric field, can supply localized thermal energy (due to the mechanical deformation induced by the changes in the electric field) to the conductive pads 225 during the hybrid bonding process. In various embodiments, the piezoelectric material can include one or more ceramics such as barium titanate ($BaTiO_3$), lead titanate ($PbTiO_3$), lead zirconate titanate (PZT), potassium niobate ($KNbO_3$), lithium niobate ($LiNbO_3$), lithium tantalate ($LiTaO_3$), sodium tungstate ($Na_2WO_4$), sodium potassium niobate (NaKNb), bismuth ferrite ($BiFeO_3$), or sodium niobate ($NaNbO_3$), and/or one or more crystalline piezoelectrics such as quartz, gallium orthophosphate ($GaPO_4$), or langasite ($La_3Ga_5SiO_{14}$). The externally-applied electric field may have a frequency of between 500 and 5,000 kHz and a field strength of between 1000 V/m and 500 kV/m.

Diagram 200B illustrates two semiconductor dies 201a and 201b (or two wafers including the semiconductor dies 201a and 201b) that are attached together to form the bonding interface 205 as described with reference to FIG. 1 (e.g., diagram 100B). As shown in diagram 200B, two semiconductor dies 201a and 201b are arranged such that the conductive pads 225 of the semiconductor dies 201a and 201b are aligned to each other—e.g., the conductive pad 225a aligned to the conductive pad 225d. The regions 210 of piezoelectric material are disposed below an outermost surface in the dielectric layer 120 such that the dielectric-to-dielectric bonding area and/or bonding strength is not reduced due to the presence of the piezoelectric material. In other embodiments, however, in which the piezoelectric material do not negatively impact the bonding strength of the dielectric material at the bonding interface 205, the regions may extend all the way to the surface at the bonding interface 205.

Subsequently, the piezoelectric material of the regions 210 material may be energized (e.g., by exposing them to an externally-applied alternating electric field) to provide heat energy (e.g., localized thermal energy) to the conductive pads 225. As a result of energizing the piezoelectric material of the regions 210, the CTE-based expansion of the conductive pads 225 may occur as indicated with arrows pointing toward the bond interface 205. For example, the piezoelectric material of region 210a provides localized thermal energy to the conductive pad 225a (and to the conductive pad 225d, in some cases). The semiconductor dies 201a and 201b (or the wafers including the semiconductor dies 201a and 201b) may also be brought to an elevated temperature to facilitate the CTE-based expansion of the conductive pads 225. In this regard, the semiconductor dies 201a and 201b may be disposed in a chamber in which an alternating electric field may be generated, and which may optionally be heated (e.g., an oven).

The surface of the conductive pads 225 may expand toward the surface of the dielectric layer 120 (toward the bonding interface 205) in response to receiving the localized thermal energy provided by the piezoelectric material of the regions 210. In some embodiments, the surface of the conductive pad 225 expands to (or past) the surface of the dielectric layer 120 (or the bonding interface 205) in response to receiving the localized thermal energy provided by the piezoelectric material. In such embodiments, the localized thermal energy provided by the piezoelectric material is sufficient to form metallic bonding interface between the conductive pads 225—e.g., between the conductive pads 225a and 225d. Thus, a post bond annealing process may be omitted.

In some embodiments, the surface of the conductive pad 225 expands toward the surface of the dielectric layer 120 (toward the bonding interface 205) in response to receiving the localized thermal energy provided by the piezoelectric material of the regions 210, but may not reach the bonding interface 205. In such embodiments, the localized thermal energy provided by the piezoelectric material is insufficient to form metallic bonding interface between the conductive pads 225—e.g., between the conductive pads 225a and 225d.

As such, a post bond annealing process may be carried out to form the metallic bonding interface in addition to energizing (e.g., exposing to an externally-applied alternating electric field) the piezoelectric material 210. The post bonding annealing process may bring the attached semiconductor dies 201a/b to a temperature (e.g., 200° C., 250° C., 300° C., or the like) less than the temperature (e.g., 380° C., 400° C., 420° C., or the like) for the conductive pads 225 to directly bond to each other absent the localized thermal energy provided by the piezoelectric material. In other words, the localized thermal energy provided by the energized piezoelectric material may be a portion of the total thermal energy for the surface of the conductive pad 225 to expand to the surface of the dielectric layer 120 (or past the surface of the dielectric layer 120) to form the metal-to-metal bonding at the bonding interface 205.

In some embodiments, the regions 210 of piezoelectric material can be surrounded (e.g., enclosed) by dielectric material. For example, in addition to being laterally surrounded by such dielectric material, region 210 may also be spaced vertically from other structures (e.g., through silicon vias, lower layers of BEOL metallization, semiconductor circuit elements) to avoid substantial heat transfer to underlying or overlying circuitry. In some embodiments, the dielectric material disposed over the regions 210 of piezoelectric material may be deposited separately from a bulk dielectric material (e.g., with an interface between the later-deposited layer and the bulk dielectric material). The thickness of the overlying dielectric material above the regions 210 of piezoelectric material may be different from spacing of the regions 210 from the conductive pads 225.

Although the foregoing example schematic diagrams illustrate both semiconductor dies 201a/b having regions 210/211 of piezoelectric material, the present technology is not limited thereto. For example, one of the semiconductor dies 201a or 201b may not include the regions 210/211 of piezoelectric material.

Figure 3:
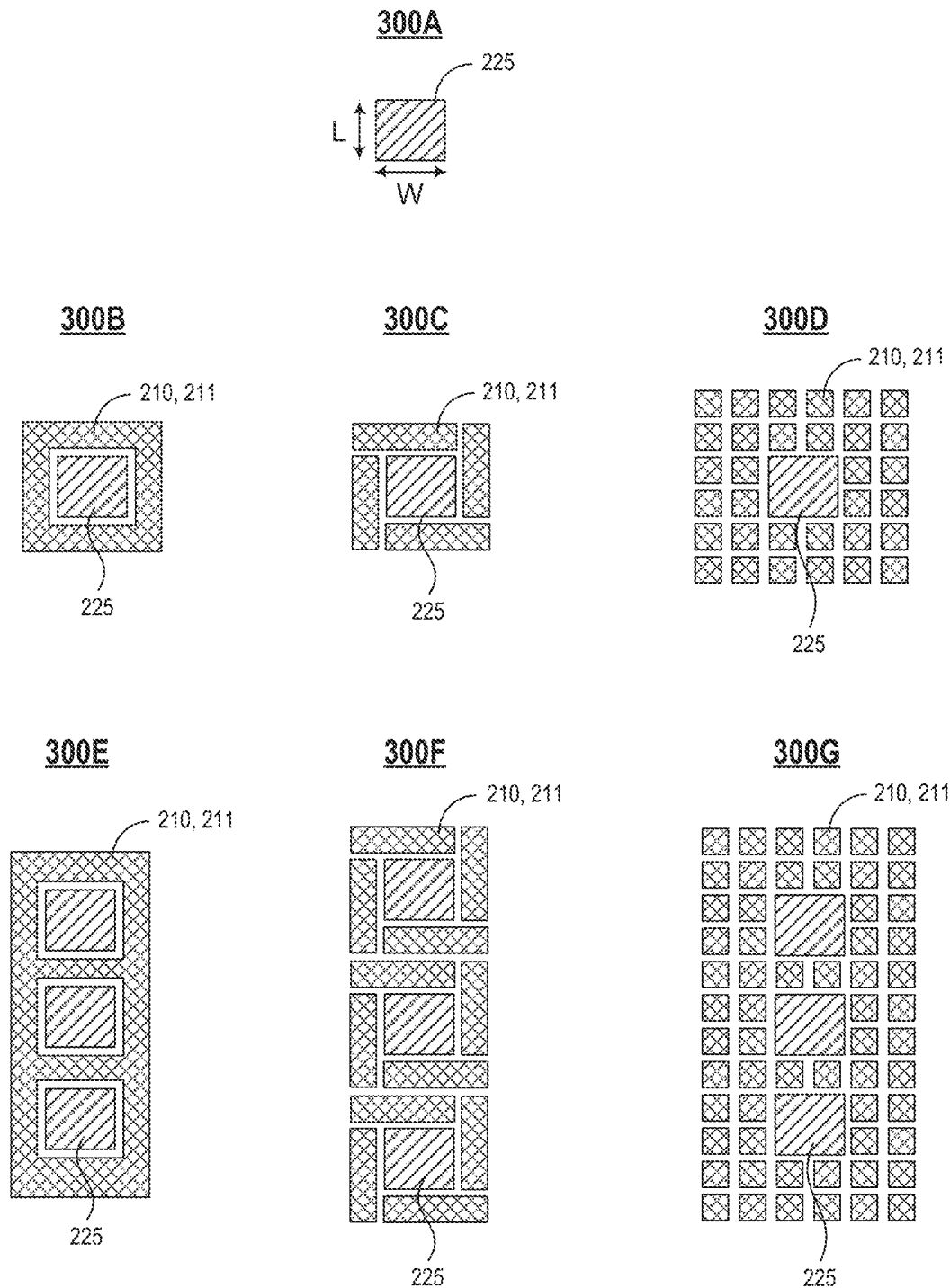
FIG. 3 illustrates top-down views of conductive pads of semiconductor dies in accordance with embodiments of the present technology.

FIG. 3 illustrates top-down views of conductive pads 225 of semiconductor dies (e.g., the semiconductor die 201) in accordance with embodiments of the present technology. Diagram 300A depicts a conductive pad 225 (a copper pad, a bond pad, a conductive component) having a width (W) and a length (L). In some embodiments, the width and length are comparable as depicted in diagram 300A. In other embodiments, the width and length are dissimilar (e.g., elongated rectangles). In some embodiments, the width (and/or length) can be less than 1 micrometer (μm). The shape and dimensions of the conductive pad 225 described with reference to FIG. 3 are examples only and the present technology is not limited thereto. For example, conductive pads 225 may have footprints (layout) resembling circles, ellipses, race-tracks, rectangles with dissimilar widths and lengths, or any polygon shapes. Further, the conductive pad 225 can have widths greater than 1, 5, 10 μm, or even greater.

Diagrams 300B through 300D illustrate various arrangements of regions 210/211 of piezoelectric material surrounding the conductive pads 225. Diagrams 300B, 300C, and 300D may correspond to a top-down view of one of the conductive pads 225 depicted in diagram 200A/B (or 200B/D), where the regions 210/211 of piezoelectric material are located proximate to the conductive pads 225. For example, diagram 300B illustrates the regions 210/211 of piezoelectric material surrounding (encircling) the conductive pad 225. Diagram 300C illustrates that the regions 210/211 of piezoelectric material surrounding the conductive pad 225 includes multiple strips. Diagram 300D illustrates that the regions 210/211 of piezoelectric material surrounding the conductive pad 225 include multiple patterns of squares or rectangles (which may be referred to as a sea of squares/rectangles), where one or more square/rectangle patterns at least partially overlapping the conductive pad 225 are removed—e.g., during the layout of the conductive pads 225.

In some embodiments, some regions 210/211 of piezoelectric material may be larger than other regions 210/211 to provide different amounts of localized thermal energy (e.g., to different size or more remotely-spaced conductive pads 225). In this regard, the size (e.g., volume) of the regions 210/211 of piezoelectric material may correspond to the volume of the conductive pads 225 to which they are proximate (e.g., having an approximately equivalent volume, having a volume at least 50% of the volume of the conductive pad, having a volume at least 200% of the conductive pad, having a cumulative volume of piezoelectric material in multiple regions proximate to a conductive pad equal to at least some percentage of the volume of the conductive pad, such as 100%, 150%, 200%, 250%, 300%, etc.) In some embodiments, the regions 210/211 of piezoelectric material may be located in one or more regions of the semiconductor dies where the conductive pads 225 are located. For example, some semiconductor dies (e.g., the semiconductor die 201) may include the conductive pads 225 located in certain regions (e.g., a central region, peripheral regions, one or more regions near edges) of the semiconductor dies—e.g., for compact layouts of the semiconductor dies, for efficient signal routing schemes. FIG. 3 includes diagrams 300E through 300G depicting such regions of the semiconductor dies (e.g., regions including three (3) conductive pads 225). Although diagrams 300E through 300G illustrate three (3) conductive pads 225 in such regions as examples, the present technology is not limited thereto. For example, the region where the conductive pads are located may include several tens of conductive pads, several hundreds of conductive pads, or even more.

Figure 4:
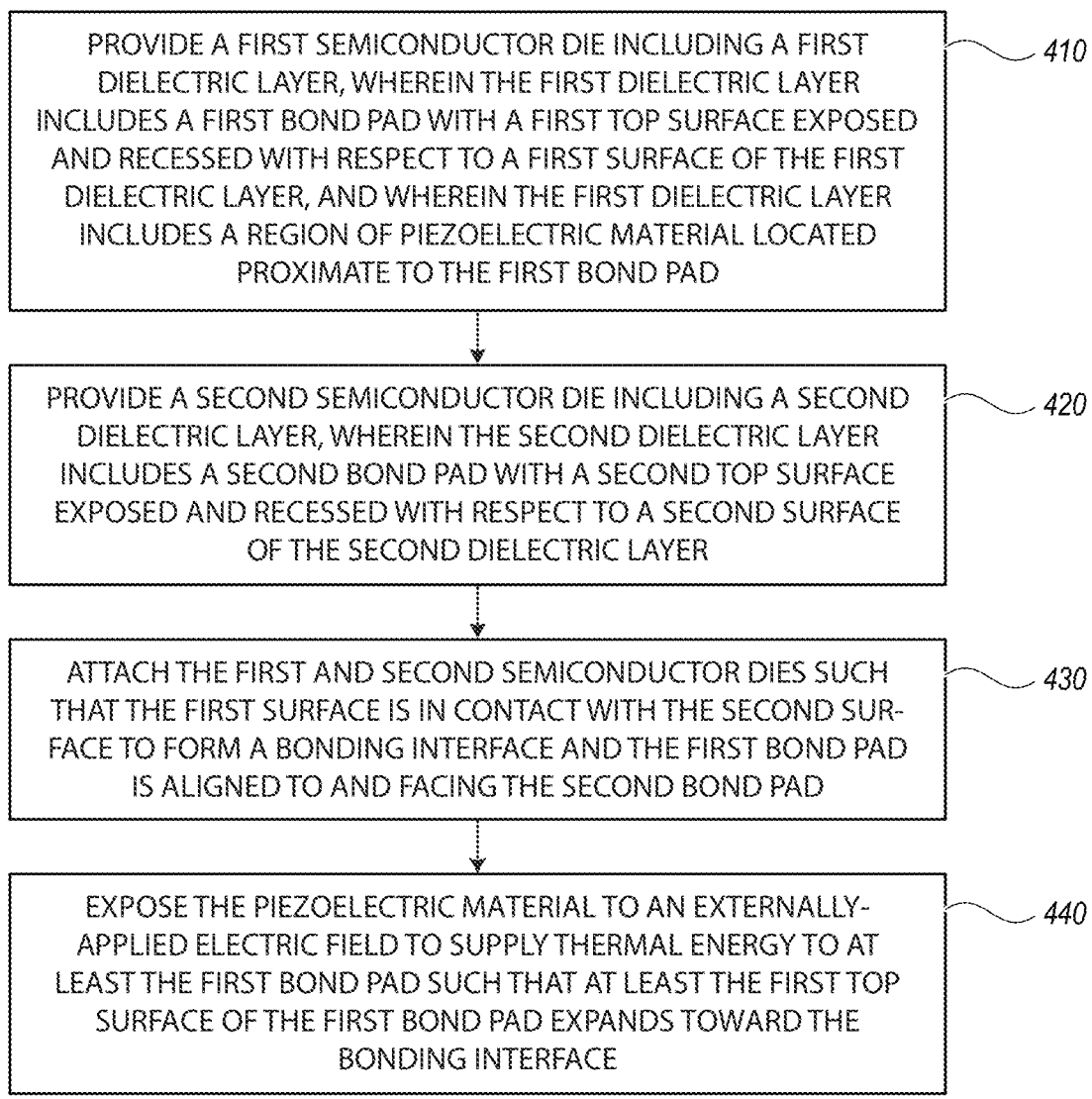
FIG. 4 is a flowchart of a method of forming semiconductor die assemblies in accordance with embodiments of the present technology.

FIG. 4 is a flowchart 400 of a method of forming semiconductor die assemblies in accordance with embodiments of the present technology. The flowchart 400 may include aspects of methods as described with reference to FIGS. 1 through 3. The method comprises providing a first semiconductor die including a first dielectric layer, wherein the first dielectric layer includes a first bond pad with a first top surface exposed and recessed with respect to a first surface of the first dielectric layer, and wherein the first dielectric layer includes a region of piezoelectric material located proximate to the first bond pad (box 410). The method further comprises providing a second semiconductor die including a second dielectric layer, wherein the second dielectric layer includes a second bond pad with a second top surface exposed and recessed with respect to a second surface of the second dielectric layer (box 420). The method further comprises attaching the first and second semiconductor dies such that the first surface is in contact with the second surface to form a bonding interface and the first bond pad is aligned to and facing the second bond pad (box 430). The method further comprises exposing the piezoelectric material to an externally-applied electric field to supply thermal energy to at least the first bond pad such that at least the first top surface of the first bond pad expands toward the bonding interface (box 440).

In some embodiments, the thermal energy is sufficient for the first and second top surfaces of the first and second bond pads to bond to each other as a result of supplying the thermal energy to the first and/or second bond pads. In some embodiments, both the first and second top surfaces of the first and second bond pads expand toward to the bonding interface in response to receiving the thermal energy. In some embodiments, the method further comprises heating, concurrently with applying the alternating electric field, the first and second semiconductor dies attached to each other to a first temperature such that the first and second top surfaces of the first and second bond pads expand toward the bonding interface to directly bond to each other, where the first temperature is less than a second temperature for the first and second bond pads to directly bond to each other absent the thermal energy.

In some embodiments, the region of piezoelectric material is a first region and the thermal energy is a first thermal energy, and the second semiconductor die includes a second region of piezoelectric material, and the method further comprises energizing (e.g., by exposing to an externally-applied alternating electric field) the piezoelectric material of the second region to supply second thermal energy to at least the second bond pad such that the second top surface of the second bond pad expands toward the bonding interface. In some embodiments, a sum of the first and second thermal energy is sufficient for the first and second top surfaces of the first and second bond pads to bond to each other as a result of supplying the first and second thermal energy to the first and/or second bond pads. In some embodiments, the method further comprises heating, concurrently with energizing the piezoelectric materials of the first and second regions, the first and second semiconductor dies attached to each other to a first temperature such that the first and second top surfaces of the first and second bond pads expand toward the bonding interface to directly bond to each other, where the first temperature is less than a second temperature for the first and second bond pads to directly bond to each other absent the first and second thermal energy.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

Figure 5:
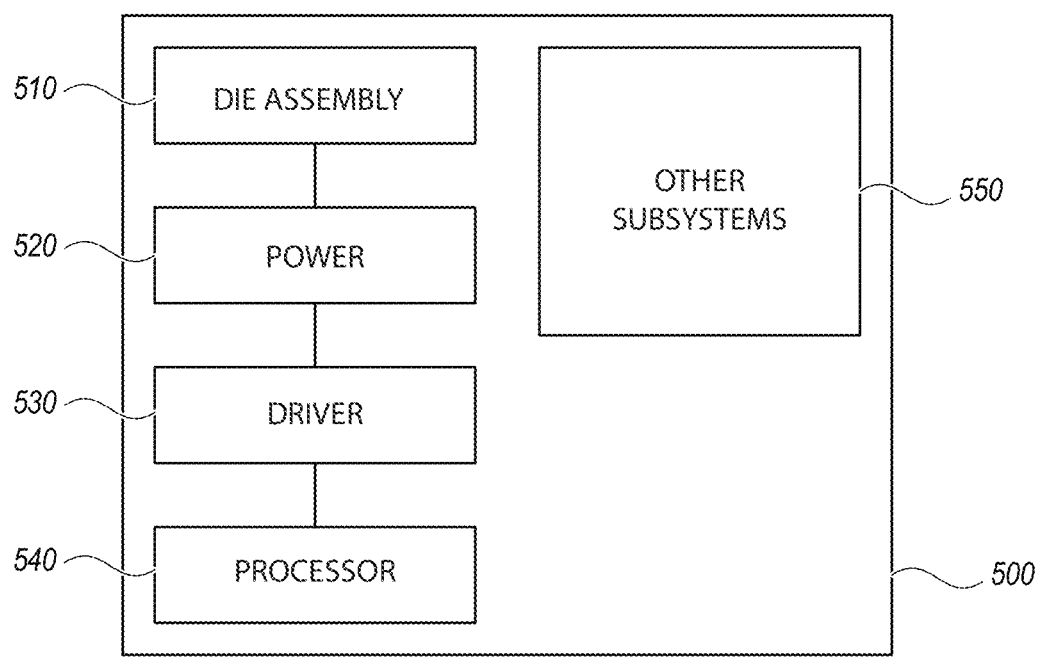
FIG. 5 is a block diagram schematically illustrating a system including a semiconductor die assembly in accordance with embodiments of the present technology.

FIG. 5 is a block diagram schematically illustrating a system 500 including a semiconductor die assembly in accordance with embodiments of the present technology. The system 500 can include a semiconductor device assembly 570, a power source 572, a driver 574, a processor 576, and/or other subsystems or components 578. The semiconductor device assembly 570 can be incorporated into any of a myriad of larger and/or more complex systems, a representative example of which is the system 500 shown schematically in FIG. 5. The semiconductor die assembly described with reference to FIG. 2 may be included in the semiconductor device assembly 570 of the system 500.

The semiconductor device assembly 570 can have features generally similar to the semiconductor die assembly described above with reference to FIG. 2. For example, the semiconductor device assembly 570 includes two semiconductor dies (e.g., a first semiconductor die 201a and a second semiconductor die 201b) that are directly bonded to each other. The semiconductor dies each includes conductive pads and regions of piezoelectric material in a dielectric layer, where the regions are located proximate to the conductive pads to supply localized thermal energy to the conductive pads in response to energizing the piezoelectric material (e.g., by exposing them to an externally-applied alternating electric field).

In some embodiments, the conductive pads of the first semiconductor die (e.g., conductive pads 225a-c) are aligned and directly bonded to the corresponding conductive pads of the second semiconductor die (e.g., conductive pads 225d-f) based, at least in part, on CTE-based thermal expansion of the conductive pads to conjoin at the bonding interface in response to the localized thermal energy generated by the piezoelectric material. In some embodiments, the conductive pads of the first semiconductor die are directly bonded to the conductive pads of the second semiconductor die at a first temperature less than a second temperature for the thermal expansion of the conductive pads absent the localized thermal energy generated by the piezoelectric material.

The resulting system 570 can perform any of a wide variety of functions, such as memory storage, data processing, and/or other suitable functions. Accordingly, representative systems 570 can include, without limitation, handheld devices (e.g., mobile phones, tablets, digital readers, and digital audio players), computers, and appliances. Components of the system 570 may be housed in a single unit or distributed over multiple, interconnected units (e.g., through a communications network). The components of the system 570 can also include remote devices and any of a wide variety of computer readable media.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die, comprising:
   a semiconductor substrate;
   a dielectric layer over the semiconductor substrate;
   a bond pad in the dielectric layer, the bond pad including an exposed top surface that is recessed with respect to a surface of the dielectric layer opposite to the semiconductor substrate; and
   a region of piezoelectric material in the dielectric layer, wherein the region is located proximate to the bond pad to supply thermal energy to the bond pad in response to exposing the piezoelectric material to an externally-applied electric field.

2. The semiconductor die of claim 1, wherein:
   the bond pad is a first bond pad of a plurality of bond pads of the semiconductor die; and the region is a first region of a plurality of regions of the piezoelectric material of the semiconductor die, wherein individual regions of the plurality of regions are located proximate to corresponding bond pads of the plurality of bond pads.

3. The semiconductor die of claim 1, wherein the thermal energy is a portion of total thermal energy for the top surface of the bond pad to expand at least to the surface of the dielectric layer.

4. The semiconductor die of claim 1, wherein the piezoelectric material comprises barium titanate (BaTiO3), lead titanate (PbTiO3), lead zirconate titanate (PZT), potassium niobate (KNbO3), lithium niobate (LiNbO3), lithium tantalate (LiTaO3), sodium tungstate (Na2WO4), sodium potassium niobate (NaKNb), bismuth ferrite (BiFeO3), sodium niobate (NaNbO3), quartz, gallium orthophosphate (GaPO4), langasite (La3Ga5SiO14), or a combination thereof.

5. The semiconductor die of claim 1, wherein a lateral spacing between the region of piezoelectric material and the bond pad is less than a width of the bond pad.

6. A method, comprising:
providing a first semiconductor die including a first dielectric layer, wherein the first dielectric layer includes a first bond pad with a first top surface exposed and recessed with respect to a first surface of the first dielectric layer, and wherein the first dielectric layer includes a region of piezoelectric material located proximate to the first bond pad;
providing a second semiconductor die including a second dielectric layer, wherein the second dielectric layer includes a second bond pad with a second top surface exposed and recessed with respect to a second surface of the second dielectric layer;
attaching the first and second semiconductor dies such that the first surface is in contact with the second surface to form a bonding interface and the first bond pad is aligned to and facing the second bond pad; and
exposing the piezoelectric material to an externally-applied electric field to supply thermal energy to at least the first bond pad such that at least the first top surface of the first bond pad expands toward the bonding interface.

7. The method of claim 6, wherein the thermal energy is sufficient for the first and second top surfaces of the first and second bond pads to bond to each other as a result of supplying the thermal energy to the first and/or second bond pads.

8. The method of claim 6, wherein both the first and second top surfaces of the first and second bond pads expand toward to the bonding interface in response to receiving the thermal energy.

9. The method of claim 6, further comprising:
heating, concurrently with exposing the piezoelectric material to the externally-applied electric field, the first and second semiconductor dies attached to each other to a first temperature such that the first and second top surfaces of the first and second bond pads expand toward the bonding interface to directly bond to each other, wherein the first temperature is less than a second temperature for the first and second bond pads to directly bond to each other absent the thermal energy.

10. The method of claim 6, wherein the externally-applied electric field is an oscillating electric field or a rotating electric field.

11. The method of claim 6, wherein the externally-applied electric field has a frequency between 500 and 5,000 kHz and a field strength of between 1000 V/m and 500 kV/m.

12. The method of claim 6, wherein the piezoelectric material comprises barium titanate (BaTiO3), lead titanate (PbTiO3), lead zirconate titanate (PZT), potassium niobate (KNbO3), lithium niobate (LiNbO3), lithium tantalate (LiTaO3), sodium tungstate (Na2WO4), sodium potassium niobate (NaKNb), bismuth ferrite (BiFeO3), sodium niobate (NaNbO3), quartz, gallium orthophosphate (GaPO4), langasite (La3Ga5SiO14), or a combination thereof.

13. A semiconductor device assembly, comprising:
a first semiconductor die including a first dielectric layer, wherein the first dielectric layer includes a first bond pad and a region of piezoelectric material proximate to the first bond pad; and
a second semiconductor die including a second dielectric layer, wherein the second dielectric layer includes a second bond pad;
wherein the first dielectric layer and the second dielectric layer are directly bonded by a dielectric-dielectric bond, and
wherein the first bond pad and the second bond pad are directly bonded by a metallurgical bond.

14. The semiconductor device assembly of claim 13, wherein:
the first bond pad is comprised by a first plurality of bond pads of the first semiconductor die; and
the region is a first region of a plurality of regions of piezoelectric material of the first semiconductor die, wherein individual regions of the plurality of regions are located proximate to corresponding bond pads of the first plurality of bond pads.

15. The semiconductor device assembly of claim 13, wherein a lateral spacing between the region of piezoelectric material and the first bond pad is less than a width of the first bond pad.

16. The semiconductor device assembly of claim 13, wherein the second dielectric layer includes a second region of piezoelectric material proximate to the second bond pad.

17. The semiconductor device assembly of claim 16, wherein the first region and the second region are vertically aligned.

18. The semiconductor device assembly of claim 16, wherein:
the second bond pad is comprised by a second plurality of bond pads of the second semiconductor die; and
the second region is comprised by a second plurality of regions of piezoelectric material of the second semiconductor die, wherein individual regions of the plurality of second regions are located proximate to corresponding bond pads of the second plurality of bond pads.

19. The semiconductor device assembly of claim 16, wherein the first and second pluralities of regions of piezoelectric material are vertically spaced apart from a bond line between the first and second semiconductor dies by portions of the first and second dielectric layer, respectively.

20. The semiconductor device assembly of claim 13, wherein the piezoelectric material comprises barium titanate (BaTiO3), lead titanate (PbTiO3), lead zirconate titanate (PZT), potassium niobate (KNbO3), lithium niobate (LiNbO3), lithium tantalate (LiTaO3), sodium tungstate (Na2WO4), sodium potassium niobate (NaKNb), bismuth ferrite (BiFeO3), sodium niobate (NaNbO3), quartz, gallium orthophosphate (GaPO4), langasite (La3Ga5SiO14), or a combination thereof.

* * * * *